(12) United States Patent
Li

(10) Patent No.: US 7,407,878 B2
(45) Date of Patent: Aug. 5, 2008

(54) METHOD OF PROVIDING SOLDER BUMPS ON A SUBSTRATE USING LOCALIZED HEATING

(75) Inventor: Yonggang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/540,074

(22) Filed: Sep. 28, 2006

(65) Prior Publication Data

US 2008/0085595 A1    Apr. 10, 2008

(51) Int. Cl.
*H01L 21/44* (2006.01)
(52) U.S. Cl. ............... 438/614; 257/738; 257/E23.021
(58) Field of Classification Search ......... 438/612–613, 438/614
See application file for complete search history.

(56) References Cited

U.S. PATENT DOCUMENTS

| | | | |
|---|---|---|---|
| 4,806,728 A * | 2/1989 | Salzer et al. ........... 219/121.63 |
| 6,521,989 B2 * | 2/2003 | Zhou .......................... 257/698 |
| 2002/0064930 A1 * | 5/2002 | Ishikawa ..................... 438/612 |
| 2004/0222271 A1 * | 11/2004 | Tor et al. ................. 228/180.21 |
| 2004/0262779 A1 * | 12/2004 | Amagai et al. .............. 257/779 |
| 2006/0220243 A1 * | 10/2006 | Jiang et al. .................. 257/737 |
| 2006/0257615 A1 * | 11/2006 | Takano et al. .............. 428/64.4 |

* cited by examiner

*Primary Examiner*—Lex Malsawma
*Assistant Examiner*—Kimberly Trice
(74) *Attorney, Agent, or Firm*—Blakely, Sokoloff, Taylor & Zafman LLP

(57) ABSTRACT

A method of providing electrically conductive bumps on electrode pads of a microelectronic substrate. The method includes: providing a microelectronic substrate including electrode pads exhibiting an electrode pad pattern; providing solder portions onto respective ones of the electrode pads according to the electrode pad pattern; reflowing the solder portions to form solder bumps therefrom, reflowing comprising applying localized heating to each of the solder portions to reflow the same.

18 Claims, 4 Drawing Sheets

METHOD OF PROVIDING SOLDER BUMPS ON A SUBSTRATE USING LOCALIZED HEATING

FIELD

Embodiments of the present invention relate generally to solder bump forming methods and solder bump forming apparatus for forming solder bumps on electrode pads.

BACKGROUND

There are a number of solder bump forming methods according to the prior art. According to a plating method, metal is deposited on electrode pads of a microelectronic substrate through plating to form bumps. In another method typically referred to as a stencil printing method, solder paste, typically including flux, is printed onto electrode pads of a microelectronic substrate through a patterned stencil, and then, after stencil removal, the device is heated to melt the solder to form bumps therefrom. However, stencil printing sometimes results in solder paste lift-up by the stencil during stencil removal, causing significant fluctuations between solder paste amounts, on electrode pads of a substrate, which in turn lead to low volume solder bumps. The phenomenon of solder lift-up has been observed to become prevalent as solder resist opening (SRO) sizes and bump itches shrink. Solder lift-up poses problems such as missing bumps, and bum height variation in the substrate being processed for bumping, but also tends to contaminate the stencil, thus aggravating lift-up in subsequent printing processes using that same stencil. As a result of the above, it has been observed that the stencil printing method is not suited for high density interconnection structures, typically leading to high missing bump rates, and bump height variation, thus negatively affecting die attachment yields.

Different techniques have been introduced to address ever growing demands for pitch and SRO size reductions, such as pitches of about 160 microns and SRO sizes of about 80 to 90 microns. One such method involves the placement of micro balls or micro spheres of solder onto the electrode pads of a microelectronic substrate. According to an attachment mounting micro ball placement method, solder balls are sucked into a jig by vacuum suction and the solder balls then mounted onto flux-coated electrode pads of a microelectronic substrate. Another micro ball placement method involves the use of a stencil mask. According to the latter methods, solder balls are dispensed onto a ball alignment plate or stencil mask including openings therein in registration with electrode pads of a microelectronic substrate. A squeegee brush is then used to disperse the balls and press them into the mask openings. The electrode pads include flux thereon, which allows the balls to adhere thereto. The stencil mask is removed after ball placement. The solder balls are then heated and melted to form bumps.

Conventional micro ball placement poses problems however, among others where bumps are to be provided on a substrate having electrode pads and/or solder resist openings of differing sizes. A micro ball placement method, such as the attachment mounting method or the stencil mask method described above, typically results in solder bumps exhibiting significant bump height variations from bump to bump depending on the size of the electrode pad and/or solder resist opening used.

The prior art fails to provide a reliable method of providing solder bumps that do not exhibit problems typically associated with solder lift-up, such as, for example, missing bumps, bump voiding, and bump height variation. In addition, the prior art fails to provide a reliable method of providing solder bumps on electrode pads and/or solder resist openings of differing sizes on a microelectronic substrate.

Figure 1:
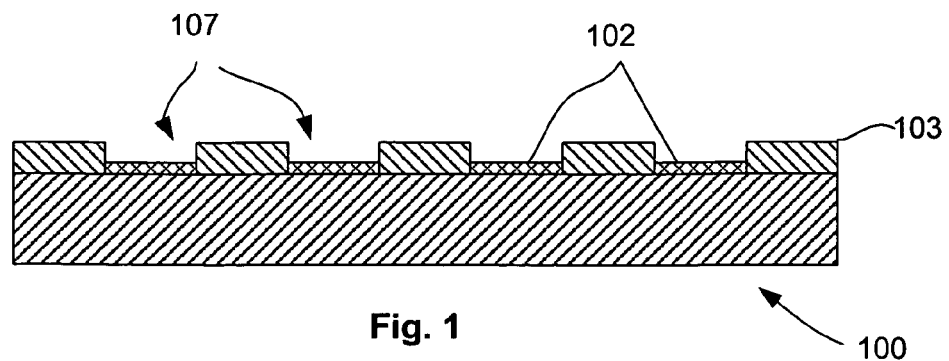
FIG. 1 is a schematic cross-sectional view of a substrate adapted to be provided with solder bumps according to a method embodiment.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method of providing solder bumps onto a microelectronic substrate is disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, a method of placing solder bumps on electrode pads of a microelectronic substrate is disclosed. In another embodiment, a bumped microelectronic substrate is disclosed. By "electrode pads," what is meant in the context of the instant description are bumping sites on a microelectronic substrate, such as under-bump metallization layers or "surface finish" layers, which allow the device to be electrically connected to other devices. Aspects of this and other embodiments will be discussed herein with respect to FIGS. 1-7, below. The figures, however, should not be taken to be limiting, as they are intended for the purpose of explanation and understanding.

Referring first to FIG. 1 by way of example, a method embodiment comprises providing a microelectronic substrate including electrode pads thereon. By "microelectronic substrate," what is meant in the context of the instant description is a substrate onto which microelectronic conductive patterns have been provided. The substrate may include either the substrate of a completed microelectronic device, or a substrate adapted to be further processed to form a microelectronic device, or a substrate, such as a printed wiring board, including conductive patterns adapted to provide interconnection between microelectronic components. For example the substrate can be an organic build-up substrate, a ceramic substrate, or a semiconductor substrate, such as a silicon substrate of a microelectronic die. As seen in FIG. 1, a method embodiment comprises providing a microelectronic substrate 100 including electrode pads 102 thereon. The electrode pads 102 may include any well known type of surface finish on the substrate, such as, for example, under bump metallization including layers of gold and nickel as would be within the knowledge of a person skilled in the art. It is noted that embodiments are not limited to the use of a substrate having electrode pads of a uniform size and pitch, as in the case of electrode pads 102, but include within their scope the provision of electrode pads of differing or non-uniform sizes and pitches. According to one embodiment, the substrate may include a solder resist layer 103 thereon. The solder resist layer 103 (also called a "solder mask" or "stop-off") is an insulating layer that is patterned with openings according to a pattern of the electrode pads. The solder resist may include a heat-resisting coating material applied to specific areas on the surface of a substrate, and is provided mainly as a protective film for the conductive patterns of the substrate. According to an embodiment, solder resist layer 103 may include a mixture of an epoxy resin and an acrylic resin, and may be coated onto the substrate in a well known manner. As shown, solder resist layer 103 may define solder resist openings 107 therethrough placed in registration with corresponding ones of the electrode pads 102. It is noted that embodiments are not limited to the use of a substrate including a solder resist thereon, and include within their scope a processing of a substrate free of a solder resist layer.

Figure 2:
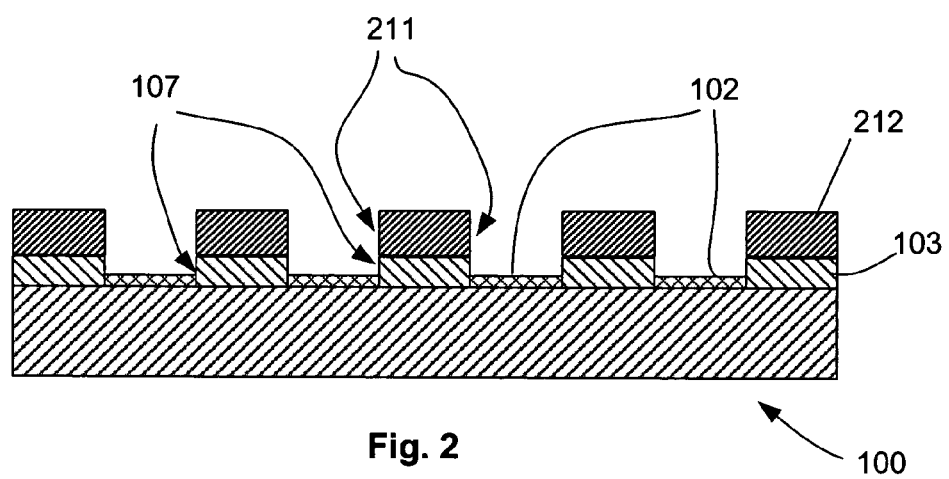
FIG. 2 is a schematic view showing solder portions in the process of being provided onto the substrate of FIG. 1 according to a first method embodiment.

Referring next to FIG. 2 by way of example, an embodiment contemplates disposing a mask 212 onto the substrate 100 such that openings 211 defined in the mask are placed in registration with the electrode pads 102 and further in registration with the solder resist openings 107 of the solder resist layer 103. As seen in FIG. 2, a mask, such as mask 212, according to an embodiment may include a pattern of openings 211 therein, the pattern corresponding to a pattern of electrode pads 102 of the substrate 200. The mask may include any suitable material as would be within the knowledge of a skilled person, such as, for example, a metal mask or a mask made of an organic material. The mask may be made of a material that is not wettable by the solder, that has a uniform thickness to allow solder printing, and that can withstand temperatures associated with a reflow of the solder therein, such as, for example, temperature of about 200 degrees Celsius for the duration of the reflow. The mask may comprise, for example, stainless steel, a nickel alloy or a chrome alloy. Additionally, the mask may be placed onto the substrate in any well known manner. After placement of the mask 212 onto substrate 100 such that openings 211 register with electrode pads 102, and with solder resist openings 107, solder portions may be provided onto respective ones of the electrode pads 202 as will be explained hereinafter with respect to the embodiments of FIGS. 3a and 3b.

Figure 3A:
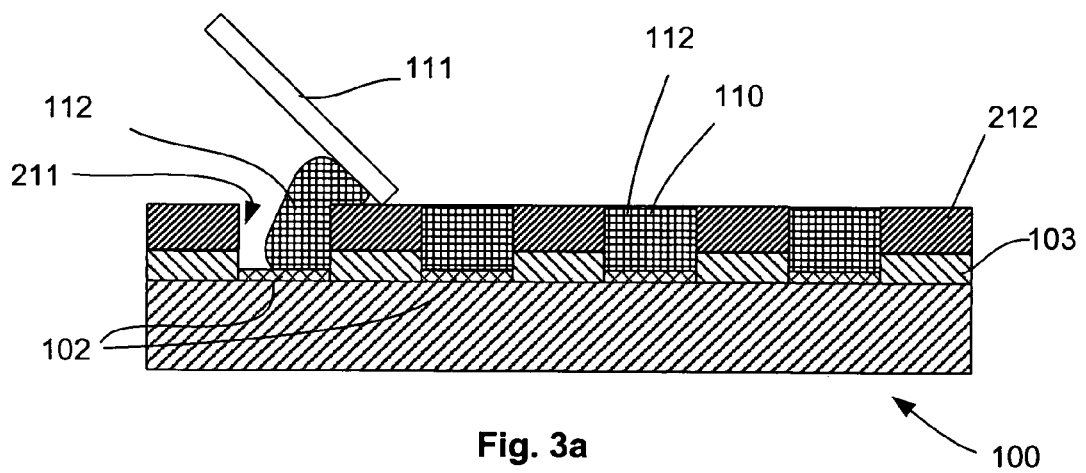
FIGS. 3a and 3b are respective schematic views of an intermediate structure obtained from placed solder portions onto the substrate of FIG. 1 according to two method embodiments.
Figure 3B:
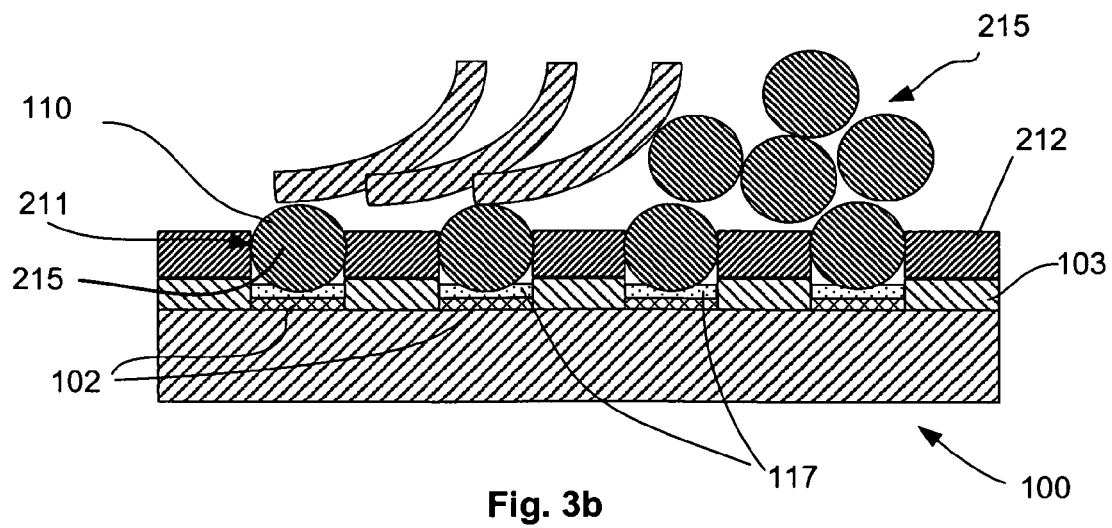

As shown in FIGS. 3a and 3b by way of example, method embodiments comprise providing solder portions 110 onto respective ones of the electrode pads. According to a preferred embodiment as shown in FIG. 3a, the solder portions 110 comprise solder paste 112. The solder paste 112 preferably comprises a fluxing agent, and may be provided onto respective ones of the electrode pads 102 in any one of well known manners, such as, for example, by using a squeegee 111 to apply the paste onto the electrode pads 102 through the openings 211 of mask 212. Other manners of applying the solder paste 112 are within the purview of the skilled person. According to an alternative embodiment as shown in FIG. 3b, the solder portions 110 comprise solder balls 215, which solder balls may be provided onto the respective electrode pads according to any one of well known microball placement methods. According to one embodiment, a squeegee brush 214 may be used to disperse the solder balls 215 and squeeze them into openings 211 of mask 212 in a well known manner. According to another embodiment, a vacuum plate mounted on a bonding head (not shown) may be used to place the solder balls 215 onto respective ones of the electrode pads in a well known manner. It is noted that embodiments are not limited to a placement of solder portions onto the substrate using either a squeegee or a vacuum plate, but include within their scope any well known manner of placing the solder portions, such as solder balls, including, for example, using electrostatic means for placing the solder balls onto the substrate. Where the solder portions 110 include solder balls 215, optionally, a flux material 117, such as, for example, a no-clean flux, may be provided onto the electrode pads, for example through openings 211 of mask 212, prior to the placement of the solder balls 215 onto the electrode pads 102. Plasma gas may also be used in a well known manner in order to remove oxidation from the electrode pads 102 before a placement of the solder portions, such as solder paste 112 or solder balls 215 thereon. A placement of the solder portions, such as solder paste 112 or solder balls 215, onto electrode pads 102, for example according to respective ones of the embodiments of FIG. 3a or FIG. 3b, results in the formation of intermediate structure 222a and 222b as shown in FIGS. 4a and 4b respectively.

Figure 4A:
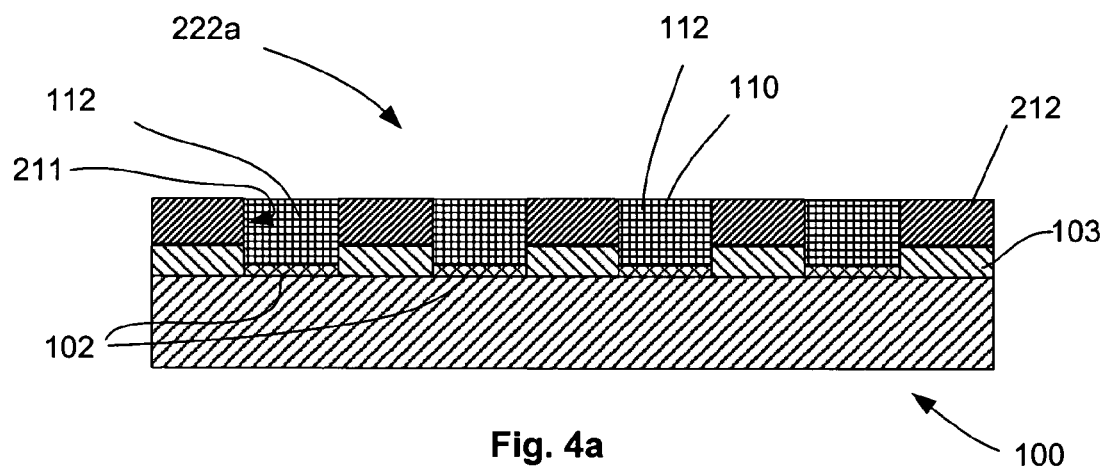
FIGS. 4a and 4b are respective schematic views of the intermediate structure of FIGS. 3a and 3b as undergoing reflow according to an embodiment.
Figure 4B:
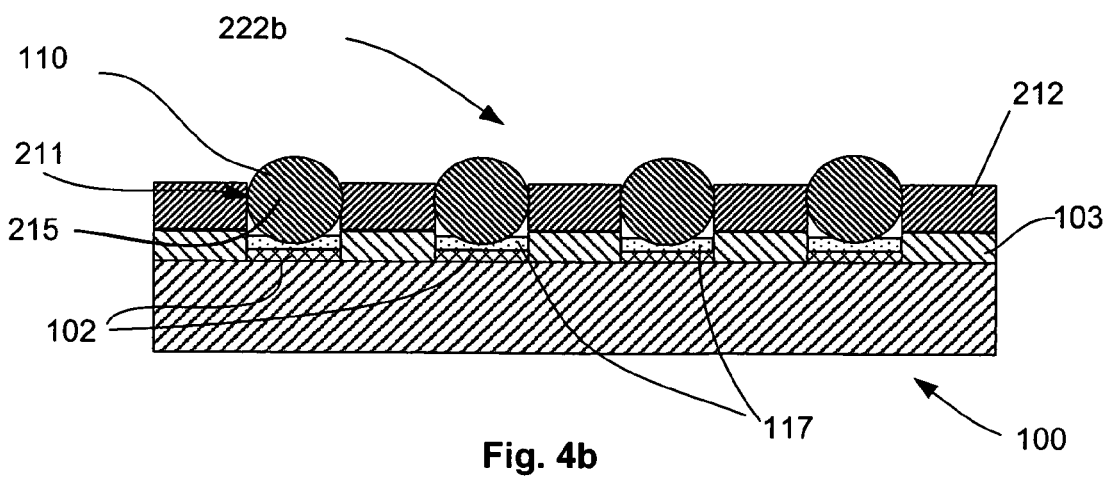

Referring now to FIGS. 4a and 4b by way of example, method embodiments comprise, after providing the solder portions 110 on respective ones of the electrode pads 102, reflowing the solder portions comprising applying localized heating to each of the solder portions. By "localized heating" applied to each of the solder portions, what is meant in the context of the instant description is a heating of each of the solder portions by way of directing or guiding energy to each of the solder portions. According to a preferred embodiment, a localized heating of the solder portions 110 for example, comprises heating each of the solder portions 110 by directing a laser beam to each of the solder portions 110 in order to heat the same. Directing such laser beam may include focusing the laser beam. Thus, as seen in FIGS. 4a and 4b, according to a preferred embodiment, reflow of solder portions 110, whether such solder portions include solder paste 112 as in FIG. 3a, or solder balls 215 as in FIG. 3b, may include focusing a guided laser beam 302 (FIG. 5) onto each one of the solder portions 110.

Figure 5:
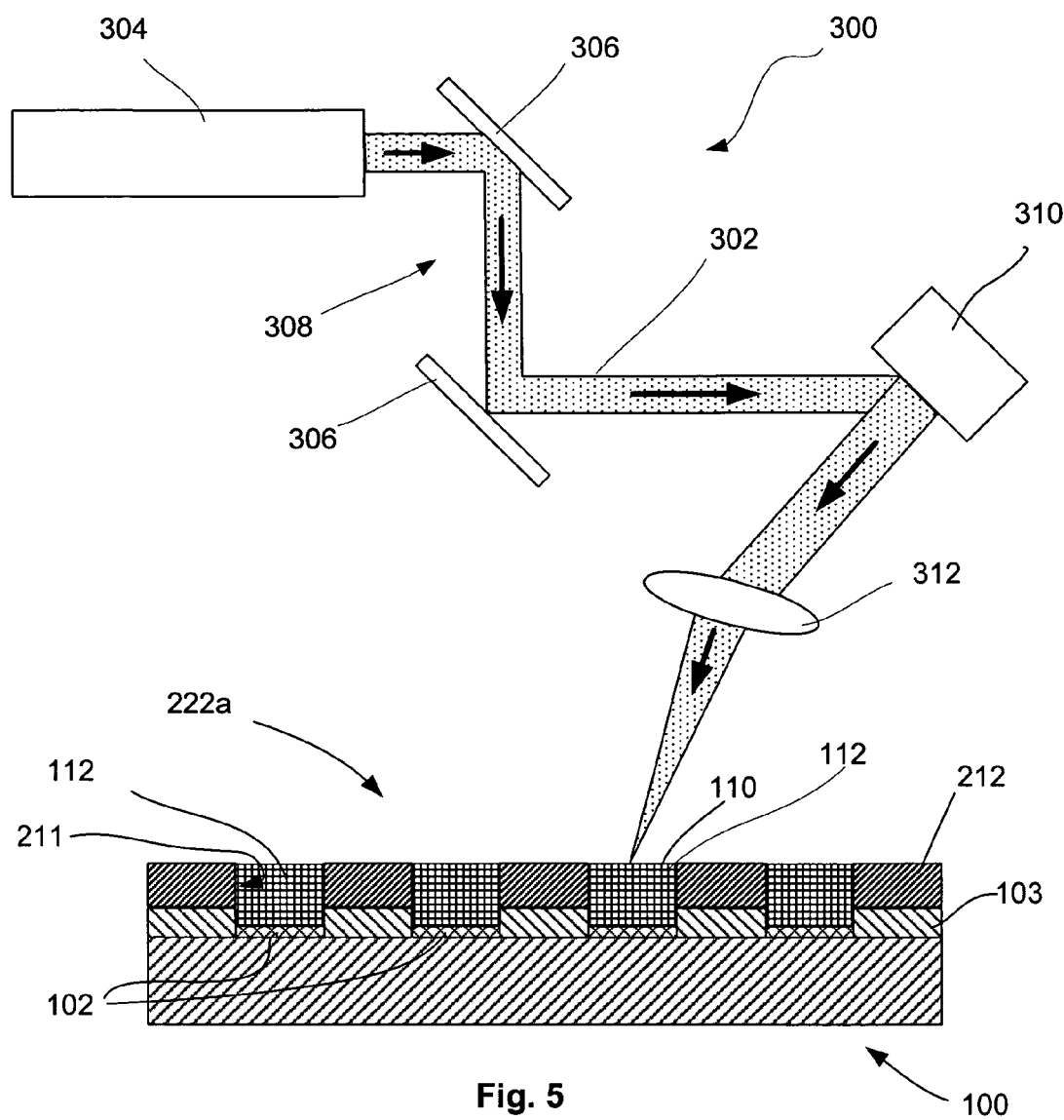
FIG. 5 is a schematic view of a laser delivery system adapted to be used to apply localized heating to the intermediate structure of FIG. 4a according to a method embodiment.

Referring now to FIG. 5, the laser beam 302 may, according to one embodiment, be generated and controlled by a laser delivery system 300 including a laser oscillator 304, such as, for example, a $CO_2$ laser (having a wavelength between about 9.3 and about 10.8 microns) or an IR spectrum laser (having a wavelength between about 0.7 and about 3.0 microns), such as an IR YAG laser. It is to be noted that lasers having other wavelength ranges are also within the purview of embodiments. In addition, other ways of applying localized heating are likewise within the purview of embodiments, such as, for example, electron beams or ion beams directed toward each solder portion to reflow the same. It is noted that, although FIG. 5 depicts localized heating of the intermediate structure 222a of FIG. 4a, the same arrangement as shown in FIG. 5 may be used to effect localized heating of the intermediate structure 222b of FIG. 4b pertaining to the use of solder balls as solder portions. The laser delivery system may be controlled to deliver the laser beam to each solder portion at a power that is a function of a composition and a volume of each solder portion to be reflowed. The laser delivery system 300 may also include one or more mirrors, such as reflection mirrors 306, to deflect the laser beam 302 generated by oscillator 304 along the optical path 308 marked by arrows as shown in FIG. 5. In addition, one or more scanners 310 may be used to scan the laser beam 302 reflected from reflection mirrors 306. The scanner 310 may be adapted to direct or guide the laser beam 302 through a range of positions on the intermediate structure 222a by way of controlling a deflection angle of the scanner 310. The scanner 310 may have a scanning frequency of about 500 to about 2000 Hz, although other frequencies are within the purview of embodiments. The scanner may include a galvano scanner, a polygon mirror scanner, an acousto-optical scanner, and an eletro-optical scanner. Other scanners are within the purview of embodiments. The laser delivery system 300 may, according to an embodiment, be similar to well known laser delivery systems adapted to drill via openings in a workpiece such as a microelectronic substrate. The laser beam 302 thus deflected by the scanner 310 may then be focused onto the intermediate structure 222a by way of a F-θ (or F-theta) lens in a well known manner. In the shown embodiment, the scanner 310 may be adapted to guide laser beam 302 to individual positions on the intermediate structure 222a corresponding to the locations of each of the solder portions 110. A guiding of the laser beam 302 and a focusing of the same onto each solder portion 110, according to an embodiment, is effected to reflow each solder portion individually by heating each solder portion in a localized manner. Localized heating according to embodiments may be applied to each of the solder portions either sequentially, or simultaneously, or in any order according to application needs. A typical laser delivery system similar to one used for drilling vias in microelectronic substrates would be capable of an alignment accuracy of plus or minus about 10. In addition, where the laser oscillator is $CO_2$ laser, the laser beam may be focused down to a range between about 20 and about 100 microns, and where the laser oscillator is an IR YAG laser, the laser beam may be focused down to a range between about 2 and about 50 microns. Such high precision alignment and tight focusing would allow the laser beam 302 to be directed onto each of the solder portions 110 in a relatively accurate manner such that, where a mask such as mask 212 is used (see FIGS. 3a-4b), such mask is not directly heated by the laser beam 302. In the reflow arrangement such as the one shown in FIG. 5, the mask 212 may get some conduction heat from the solder paste 112 or solder balls 215, but such conduction heat may be low enough such that the mask 212 will not be heated up to a detrimental temperature. According to an embodiment, by controlling the parameters of the laser, such as, for example, laser power, pulse width, number of pulses, suitable temperature profiles may be achieved for solder reflow. Reference to Equation (1) below, for example, would allow the skilled artisan to determine suitable process parameters as a function of application needs. For example, a laser oscillator having excessive power, that is, power in excess of a power need to reflow a given solder portion, may be split to a suitable number of scanners each having a power adapted to reflow a given solder portion, simultaneous solder reflow of a number of solder portions in this way being possible according to an embodiment, in this way advantageously shortening processing times. As would be recognized by a person skilled in the art, reflow temperatures to be achieved by way of laser beam application would be dependent on the type and volume of solder portions being used. According to an embodiment, reflow may for example take place at temperatures above about 230 degrees Centigrade. The 230 degrees Centigrade minimum reflow temperature would for example apply to solder portions comprising a SnAg or a SnAgCu alloy. Where the electrode pads, and hence the solder portions placed on corresponding ones of the electrode pads, may have differing sizes, the localized heating may be controlled to deliver differing amounts of energy to the solder portions as a function of their differing sizes. It is noted further that embodiments are not limited to a method where reflow by localized heating occurs while a mask is disposed on the substrate, and includes within its scope localized heating that takes place in the absence of a mask. In addition, embodiments are not limited to the application of localized heating by way of a laser beam, and include within their scope any manner of applying localized heating to solder portions.

Figure 6:
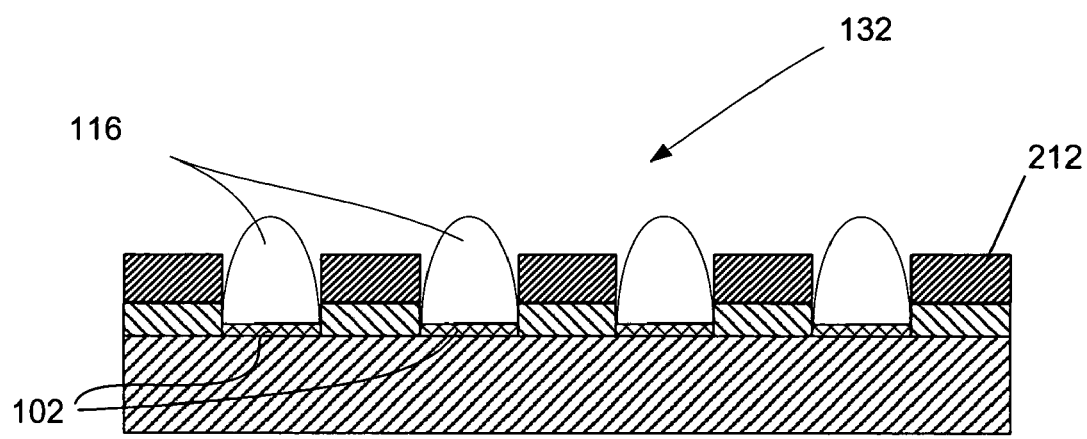
FIG. 6 is a schematic view of a bumped substrate obtained by practicing a method embodiment.

As seen in FIG. 6, a reflowing of the intermediate structure 222a of FIG. 4a as explained in relation to FIG. 5 above, or a reflowing of the intermediate structure of FIG. 4b in a manner similar to that explained in relation to FIG. 5 for structure 222a, results in the formation of solder bumps 116 from solder portions 110 onto electrode pads 102 of substrate 100, yielding a solder-bumped substrate 132 as shown. In the shown embodiment, the solder-bumped substrate 132 includes the substrate panel, the plurality of electrode pads 102 on the substrate panel, and solder bumps 116 on respective ones of the electrode pads 102. Mask 212 is also shown as still being disposed on the solder-bumped substrate 132, although it is not part of the same. The depiction of mask 212 still remaining on the solder-bumped substrate 132 has been effected in order to suggest an advantage of various embodiments that involve leaving the mask on the substrate during reflow, and removing the mask only after reflow. Advantageously, as suggested in FIG. 6, after reflow, the solder portions 110 recess away from the openings of the mask 212, and thus allow a lifting of the mask 212 without the lift-up issues and related problems associated with a lifting of the mask according to the prior art.

Advantageously, embodiments allow a localized heating of the solder bumps, in this way producing negligible heating of the substrate panel, minimizing any damage, such as warping/deformation, to the substrate, solder resist, or optional mask used to place solder portions onto the substrate during the reflow process. The method embodiment contemplating the use of a mask or stencil for a placement of the solder portions further optionally involves keeping the mask onto the substrate until after reflow, in this way eliminate issues typically related to solder lift-up. Thus, the latter method embodiment eliminates a major source of yield loss due to low volume solder bumps, and missing bumps typically associated with prior art C4 bumping processes. By eliminating problems associated with solder lift-up, an embodiment allows C4 bumping even as pitch sizes shrink to 150 microns and below, and are even suited to mixed SRO sizes and pitches. In addition, advantageously, at least where a laser beam is used as the energy source for localized heating, a method embodiment involves a processing time of the substrate which is comparable to a processing time for reflow according to the prior art. In particular, the through-put time estimation for current continuous oven reflow is about 5 to 10 minutes for a typical unit that includes 105 micron diameter solder paste deposits, considering 5000 solder bumps per unit and 100 units per panel. Assuming the following regarding the above-mentioned typical unit:

| | |
|---|---|
| Diameter of solder paste semi-sphere (DSsp) = | 105 microns |
| Density of solder paste (Dsp) = | 7.4 g/cm³ |
| Specific heat of solder paste (SHsp) = | 0.227 J/gK |
| Heat of fusion of solder paste (HFsp) = | 7.03 kJ/mol |
| Atomic volume of solder paste (AVsp) = | 16.3 cm³/mol |
| Laser power absorption of solder paste (LAsp) = | 50% |
| Laser power (LP) = | 10 W (J/s) |
| Galvano scanner frequency (GS) = | 1500 Hz |
| Reflow temperature (RT) = | 250° C. |
| Room temperature (RmT) = | 20° C. |

The total heat (TH) needed to reflow the solder paste would be given by the following equation:

$$TH = \text{Volume} \times [\text{Energy/Volume to raise the temperature of} \quad (1)$$
$$\text{solder paste} + \text{Energy/Volume to melt the solder paste}]$$
$$= [1/2 \times (4\pi/3) \times (DSsp)^3] \times [(Dsp \times SHsp \times (RT - RmT)) +$$
$$(HFsp/AVsp)]$$
$$= [1/2 \times (4\pi/3) \times (105 \times 10^{-4} \text{cm})^3] \times [(7.4 \text{ g/cm}^3 \times 0.227 \text{ J/gK} \times$$
$$(250 - 20)K) + ((7030 \text{ J/mol})/(16.3 \text{ cm}^3/\text{mol}))]$$
$$0.00198 \text{ J}.$$

The time (TE) for the laser system to input the above amount of heat energy into each solder paste deposit would be given by the following equation:

$$TE = TH/(LP \times LAsp) \quad (2)$$
$$= .00198 \text{ J}/(10 \text{ J/s} \times 50\%)$$
$$= 0.4 \text{ ms}$$

The throughput time (TPT) per panel would then be given by the following equation:

$$TPT = (TE + (1/GS)) \times (\text{bumps per unit}) \times (\text{units/panel}) \quad (3)$$
$$= (0.4 \text{ ms} + 1/1500 \text{ Hz}) \times 5000 \times 100$$
$$= 533 \text{ s}$$
$$= 8.9 \text{ min.}$$

Thus, advantageously, the throughput time according to some embodiments would be at least comparable to throughput times associated with current C4 bumping processes. It is noted, however, that the above process parameter examples, such as, for example a laser power of 10 W, are conservative relative to what would be possible, for example, with a typical laser oscillator with an associated power of about 300 W. In such cases, as noted previously, the laser beam from the oscillator could be split, in this way appreciably reducing processing times with respect to processing times of the prior art.

Figure 7:
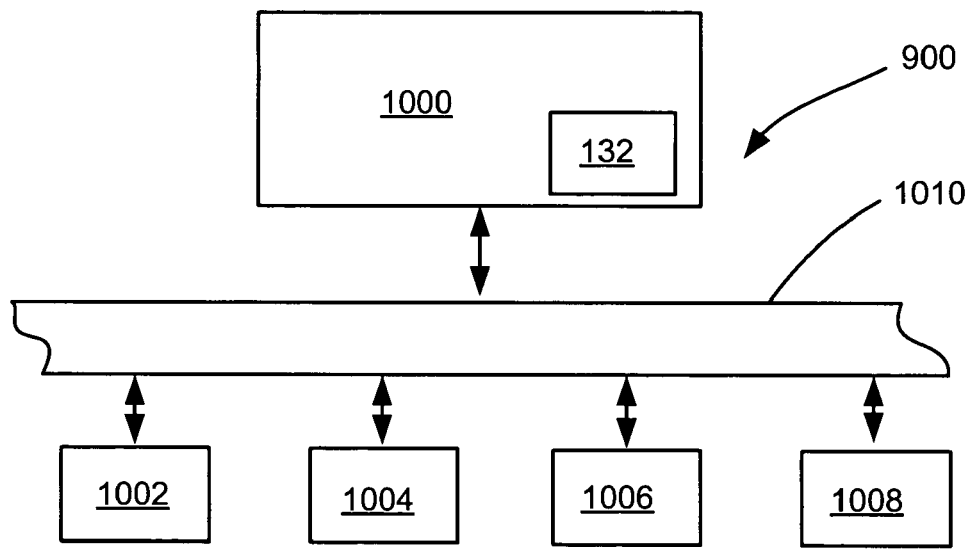
FIG. 7 is a schematic view of a system including a bumped microelectronic substrate according to an embodiment.

Referring to FIG. 7, there is illustrated one of many possible systems 900 in which embodiments of the present invention may be used. In one embodiment, the electronic assembly 1000 may include a solder-bumped substrate, such as substrate 132 of FIG. 6. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 7, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A method of providing electrically conductive bumps on electrode pads of a microelectronic substrate comprising:
    providing a microelectronic substrate including electrode pads exhibiting an electrode pad pattern;
    providing solder portions onto respective ones of the electrode pads according to the electrode pad pattern, wherein the electrode pads have non-uniform sizes, and wherein the solder portions have non-uniform sizes as a function of non-uniform sizes of the electrode pads;
    reflowing the solder portions to form solder bumps therefrom, reflowing comprising applying localized heating to each of the solder portions to reflow the same, wherein reflowing comprises controlling the localized heating to apply localized heating at differing power levels as a function of a composition and volume of a solder portion being reflowed.

2. The method of claim 1, wherein the solder portions comprise solder paste.

3. The method of claim 1, wherein The solder portions comprise solder balls.

4. The method of claim 1, further comprising:
    disposing a mask onto the substrate such that mask openings defined in the mask are placed in registration with the electrode pads, wherein providing solder portions comprises providing the solder portions onto respective ones of the electrode pads through the mask openings; and
    removing the mask after providing the solder portions.

5. The method of claim 4, wherein removing the mask comprises removing the mask after reflowing.

6. The method of claim 3, further comprising applying a flux material to the electrode pads before providing the solder balls onto respective ones of the electrode pads.

7. The method of claim 1, wherein the substrate comprises a solder resist layer thereon, the solder resist layer defining openings therein, the openings in the solder resist being disposed in registration with the electrode pads.

8. The method of claim 1, wherein applying localized heating comprises applying a laser beam to said each of the solder portions.

9. The method of claim 8, wherein applying a laser beam comprises applying a laser beam to said each of the solder portions sequentially.

10. The method of claim 8, wherein applying a laser beam comprises applying a laser beam to said each of the solder portions simultaneously.

11. The method of claim 8, wherein applying a laser beam comprises using a laser beam delivery system including:
a laser oscillator;
a mirror;
a scanner; and
a focusing lens.

12. The method of claim 11, wherein the scanner is one of a galvano scanner, a polygon mirror scanner, an acousto-optical scanner, and an eletro-optical scanner.

13. The method of claim 11, wherein the laser oscillator comprises one of a $CO^2$ laser and an IR YAG laser.

14. The method of claim 1, wherein said localized heating is adapted to raise the temperature of the solder portions to a temperature equal to or greater than 230 degrees Celsius.

15. The method of claim 11, wherein:
the laser delivery system comprises a plurality of scanners; and
applying localized heating comprises:
  splitting a laser beam from the laser oscillator to generate a plurality of split laser beams therefrom, the laser beams being distributed to the plurality of scanners; and
  applying each of said split laser beams to a corresponding one of the solder portions through a respective one of the plurality of scanners.

16. The method of claim 15, wherein the plurality of scanners comprise one of galvano scanners, polygon mirror scanners, acousto-optical scanners, and eletro-optical scanners.

17. The method of claim 1, wherein applying localized heating comprises using one of an electron beam and an ion beam.

18. The method of claim 1, wherein the electrode pads are disposed at non-uniform pitches with respect to one another.

* * * * *